United States Patent
Lee

(10) Patent No.: US 8,872,221 B2
(45) Date of Patent: Oct. 28, 2014

(54) VERTICAL THIN FILM TRANSISTOR AND FABRICATING METHOD THEREOF

(71) Applicant: Samsung Display Co., Ltd., Yongin (KR)

(72) Inventor: Jung Hun Lee, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/919,813

(22) Filed: Jun. 17, 2013

(65) Prior Publication Data

US 2014/0167048 A1 Jun. 19, 2014

(30) Foreign Application Priority Data

Dec. 18, 2012 (KR) .......................... 10-2012-0148773

(51) Int. Cl.
*H01L 29/772* (2006.01)
*H01L 29/786* (2006.01)
*H01L 29/66* (2006.01)

(52) U.S. Cl.
CPC ...... *H01L 29/78642* (2013.01); *H01L 29/6675* (2013.01)
USPC .................................. 257/135; 257/E29.262

(58) Field of Classification Search
CPC .................................................. H01L 29/0676
USPC ................ 257/302, 329, 263, 206–207, 135, 257/E29.262
See application file for complete search history.

(56) References Cited

U.S. PATENT DOCUMENTS

| 5,229,310 | A | 7/1993 | Sivan |
| 6,107,660 | A | 8/2000 | Yang et al. |
| 7,244,987 | B2 * | 7/2007 | Forbes ......................... 257/324 |
| 8,134,197 | B2 * | 3/2012 | Forbes ......................... 257/314 |
| 8,273,654 | B1 | 9/2012 | Nelson et al. |
| 2006/0125025 | A1 * | 6/2006 | Kawashima et al. ......... 257/401 |
| 2008/0014686 | A1 | 1/2008 | Wang et al. |
| 2009/0014783 | A1 * | 1/2009 | Forbes ......................... 257/329 |
| 2010/0330759 | A1 * | 12/2010 | Forbes ......................... 438/269 |
| 2011/0101338 | A1 | 5/2011 | Yamazaki et al. |
| 2011/0101355 | A1 | 5/2011 | Yamazaki |
| 2012/0088343 | A1 * | 4/2012 | Son et al. ...................... 438/239 |
| 2013/0016314 | A1 | 1/2013 | Itou et al. |
| 2013/0240983 | A1 * | 9/2013 | Larrieu ......................... 257/329 |

FOREIGN PATENT DOCUMENTS

JP 07-183528 7/1995
KR 10-2011-0089045 8/2011

* cited by examiner

*Primary Examiner* — Matthew W Such
*Assistant Examiner* — Ali Naraghi
(74) *Attorney, Agent, or Firm* — Robert E. Bushnell, Esq.

(57) ABSTRACT

A vertical thin film transistor includes a substrate, a first wall, a second wall, a source electrode, a drain electrode, a semiconductor layer, a gate insulating layer, and a gate electrode. The first wall and the second walls are spaced apart from each other on the substrate. The source electrode is formed on a top surface of the first wall. The drain electrode is provided on the substrate between the first and second walls. The semiconductor layer is formed on the source electrode, a sidewall of the first wall, and the drain electrode. The gate insulating layer covers the first and second walls, the source and drain electrodes, and the semiconductor layer. The gate electrode is disposed between the first and second walls in a planar view. The vertical thin film transistor may be formed without a mask.

17 Claims, 6 Drawing Sheets

VERTICAL THIN FILM TRANSISTOR AND FABRICATING METHOD THEREOF

CLAIM PRIORITY

This application makes reference to, incorporates into this specification the entire contents of, and claims all benefits accruing under 35 U.S.C. §119 from an application earlier filed in the Korean Intellectual Property Office filed on Dec. 18, 2012 and there duly assigned Serial No. 10-2012-0148773.

BACKGROUND OF THE INVENTION

1. Field of the Invention

The present invention relates to vertical thin film transistors and fabricating methods thereof, and more particularly to vertical thin film transistors which can be formed without a mask and methods of fabricating the same.

2. Description of the Related Art

Thin film transistors may be generally formed on a large area substrate so that they are used in a display device, a printer, a scanner, and a smart card.

The thin film transistor includes a semiconductor pattern, a source electrode, a drain electrode, and a gate electrode. The semiconductor pattern, the source electrode, the drain electrode, and the gate electrode are formed using patterning processes, including photolithography processes.

However, when the thin film transistor is formed using a mask, realization of fine patterns is difficult due to accuracy limitation of the mask and problems (e.g., bending and/or separation of the mask) which occur. Thus, it is necessary to form the thin film transistor without a mask or by use of a minimum number of masks.

The thin film transistors may be classified into a horizontal thin film transistor and a vertical thin film transistor. The horizontal thin film transistor has a channel formed between a source electrode and a drain electrode which are horizontally arranged. The vertical thin film transistor has a channel formed between a source electrode and a drain electrode which are vertically arranged. The vertical thin film transistor has a current flow greater than that of the horizontal thin film transistor. However, realization of the vertical thin film transistor may be difficult so that the vertical thin film transistor may not be easily commercialized.

SUMMARY OF THE INVENTION

Embodiments of the invention may provide vertical thin film transistors formed without a mask or bu using a minimum number of masks.

Embodiments of the invention may also provide methods of fabricating the vertical thin film transistor.

In one aspect of the invention, a vertical thin film transistor may include: a substrate; a first wall provided on the substrate; a second wall provided on the substrate and spaced apart from the first wall; a source electrode formed on a top surface of the first wall; a drain electrode provided on the substrate between the first wall and the second wall; a semiconductor layer formed on the source electrode, a sidewall of the first wall, and the drain electrode; a gate insulating layer covering the first wall, the second wall, the source electrode, the drain electrode, and the semiconductor layer; and a gate electrode formed on the gate insulating layer, the gate electrode being formed between the first wall and the second wall in a planar view.

In another aspect of the invention, a method of fabricating a vertical thin film transistor may include: forming a first wall and a second wall on a substrate; forming a source electrode on a top surface of the first wall and a drain electrode between the first wall and the second wall; forming a semiconductor layer on the source electrode, a sidewall of the first wall, and the drain electrode; forming a gate insulating layer on the first wall, the second wall, the source electrode, the drain electrode, and the semiconductor layer; and forming a gate electrode on the gate insulating layer between the first wall and the second wall.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

The present invention will become more apparent in view of the attached drawings and accompanying detailed description.

DETAILED DESCRIPTION OF THE INVENTION

Figure 1:
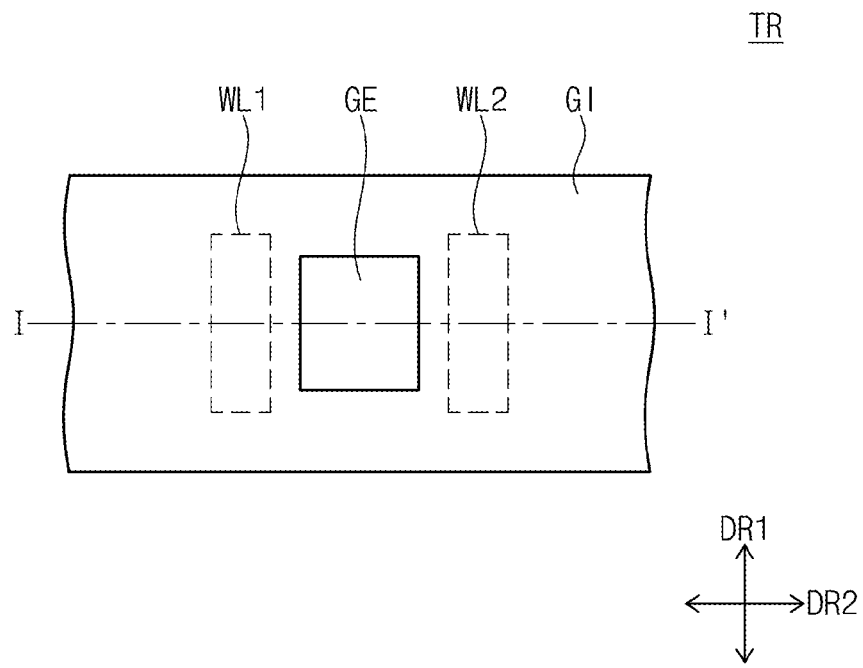
FIG. 1 is a planar view illustrating a vertical thin film transistor according to exemplary embodiments of the invention.

The invention will now be described more fully hereinafter with reference to the accompanying drawings, in which exemplary embodiments of the invention are shown. The advantages and features of the invention and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and to enable those skilled in the art to know the category of the inventive concept. In the drawings, embodiments of the inventive concept are not limited to the specific examples provided herein and are exaggerated for clarity.

Figure 2:
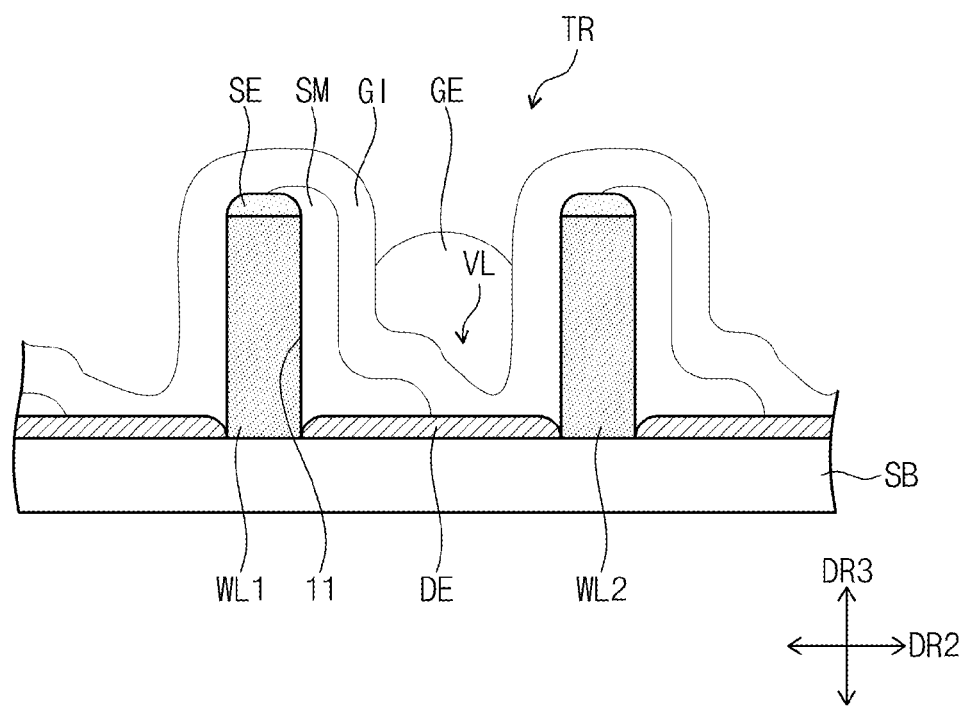
FIG. 2 is a cross-sectional view taken along a line I-I' of FIG. 1.

FIG. 1 is a planar view illustrating a vertical thin film transistor according to exemplary embodiments of the invention, and FIG. 2 is a cross-sectional view taken along a line I-I' of FIG. 1.

Referring to FIGS. 1 and 2, a vertical thin film transistor TR includes a substrate SB, a first wall WL1, a second wall WL2, a source electrode SE, a drain electrode DE, a semiconductor layer SM, a gate insulating layer GI, and a gate electrode GE.

The substrate SB may be a transparent insulation substrate. The substrate SB may be formed of glass or plastic. The plastic may include at least one selected from a group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

The first wall WL1 is disposed on the substrate SB.

The first wall WL1 has a height of about 1 μm to about 100 μm. In particular, the first wall WL1 may have a height of about 5 μm to about 20 μm. The height of the first wall WL1 corresponds to a distance between the source electrode SE and the drain electrode DE, i.e., a channel length. This will be described in more detail later.

The first wall WL1 may have a rectangular shape extending in a first direction (DR1) when viewed from a planar view. However, the inventive concept is not limited thereto. The first wall WL1 may have one of various shapes in a planar view.

The first wall WL1 may be formed of an insulating material, for example, an organic insulating material or an inorganic insulating material.

The second wall WL2 is disposed on the substrate SB. The second wall WL2 is spaced apart from the first wall WL1. The first wall WL1 and the second wall WL2 are spaced apart from each other in a second direction DR2.

The second wall WL2 may have a height equal to the height of the first wall WL1. Additionally, the second wall WL2 may have the same shape as the first wall WL1 in a planar view. The second wall WL2 may be formed of the same material as the first wall WL1.

The source electrode SE is formed on a top surface of the first wall WL1. The source electrode SE has the same area and the same shape as the top surface of the first wall WL1 in a planar view.

The source electrode SE has a height smaller than those of the first and second walls WL1 and WL2. For example, the height of the source electrode SE may be equal to or greater than about 10 nm and smaller than 1000 nm. In particular, the source electrode SE may have a height of about 50 nm to about 100 nm.

The drain electrode DE is formed on the substrate SB and is spaced apart from the source electrode SE.

The drain electrode DE may be disposed on the substrate SB between the first wall WL1 and the second wall WL2 in a planar view. However, the inventive concept is not limited thereto. In another embodiment, the drain electrode DE may be disposed in an entire area except the top surfaces of the first and second walls WL1 and WL2, respectively, in a planar view.

The drain electrode DE may have the same height as the source electrode SE.

Each of the source and drain electrodes SE and DE, respectively, may be formed in a single layer including one selected from a group consisting of molybdenum (Mo), tungsten (W), molybdenum-tungsten (multi-mode optical waveguide), aluminum-neodymium (AlNd), titanium (Ti), aluminum (Al), an aluminum alloy, silver (Ag), and a silver alloy. Alternatively, for reducing a resistance value, each of the source and drain electrodes SE and DE, respectively, may be formed of a multi-layer including at least one of low-resistance materials such as molybdenum (Mo), aluminum (Al), and silver (Ag). For example, each of the source and drain electrodes SE and DE, respectively, may be formed of one multi-layer selected from a group consisting of Mo/Al/Mo, MoW/Al—Nd/MoW, Ti/Al/Ti, Mo/Ag/Mo, and Mo/Ag-alloy/Mo.

The semiconductor layer SM is disposed on the source electrode SE, the drain electrode DE, and a sidewall 11 of the first wall WL1.

The semiconductor layer SM may include a source region, a drain region, and a channel region.

The source region is electrically connected to the source electrode SE, and the drain region is electrically connected to the drain electrode DE. The semiconductor layer SM, which is in contact with the source and drain electrodes SE and DE, respectively, is illustrated as an example in FIG. 2. However, the inventive concept is not limited thereto. If an insulating layer (not shown) is disposed between the semiconductor layer SM and the source electrode SE, and between the semiconductor layer SM and the drain electrode DE, the source region and the drain region of the semiconductor layer SM may be electrically connected to the source electrode SE and the drain electrode DE, respectively, through contact holes formed in the insulating layer (not shown).

The channel region extends along the sidewall 11 of the first wall WL1 in a third direction DR3. The third direction DR3 is a height direction of the first wall WL1. The channel region connects the source region to the drain region.

In a planar view, the semiconductor layer SM overlaps with a portion of the source electrode SE and a portion of the drain electrode DE. The semiconductor layer SM is spaced apart from the second wall WL2.

The semiconductor layer SM may have the same width as the first wall WL1 in the first direction DR1.

The semiconductor layer SM may have a thickness of about 20 nm to about 100 nm.

The semiconductor layer SM may be formed of an inorganic semiconductor (e.g., amorphous silicon or poly-crystalline silicon) or an organic semiconductor.

The gate insulating layer GI covers the first wall WL1, the second wall WL2, the source electrode SE, the drain electrode DE, and the semiconductor layer SM. The gate insulating layer GI electrically insulates the gate electrode GE from the source electrode SE, the drain electrode DE, and the semiconductor layer SM.

The gate insulating layer GI may be formed of an inorganic insulating layer or an organic insulating layer. The inorganic insulating layer of the gate insulating layer GI may include, for example, at least one of $SiO_2$, $SiN_x$, SiON, $Al_2O_3$, $TiO_2$, $Ta_2O_5$, $HfO_2$, $ZrO_2$, BST, and PZT. The organic insulating layer of the gate insulating layer GI may include, for example, one of a general commercial polymer (e.g., PMMA or PS), a polymer derivative having a phenol group, an acrylic polymer, an imide-based polymer, a polyether-based polymer, an amide-based polymer, a fluoric polymer, a p-xylene-based polymer, and a vinyl alcohol-based polymer, and any blend thereof. In some embodiments, the gate insulating layer GI may be formed as a stack layer of the inorganic insulating layer and the organic insulating layer.

The gate insulating layer GI may be disposed along surfaces of the first wall WL1 and WL2 so as to form a valley VL between the first wall WL1 and the second wall WL2.

The gate electrode GE is formed on the gate insulating layer GI. The gate electrode GE is formed so as to correspond to the valley VL. For example, the gate electrode GE may be formed in the valley VL.

The gate electrode GE is disposed between the first wall WL1 and the second wall WL2 in a planar view. The gate electrode GE is spaced apart from the first wall WL1 and the second wall WL2.

The gate electrode GE may be formed of titanium (Ti), tantalum (Ta), chromium (Cr), aluminum (Al), silver (Ag), copper (Cu), molybdenum (Mo), or any alloy thereof. FIG. 2 illustrates the gate electrode GE of a single layer. However, the inventive concept is not limited thereto. In other embodiments, the gate electrode GE may be formed as a multi-layer.

A method of fabricating a vertical thin film transistor according to exemplary embodiments will be described with reference to FIGS. 3A to 7B. FIGS. 3A, 4A, 5A, 6A, and 7A are planar views illustrating a method of fabricating the vertical thin film transistor of FIG. 1, while FIGS. 3B, 4B, 5B, 6B, and 7B are cross-sectional views taken along lines I-I' of FIGS. 3A, 4A, 5A, 6A, and 7A, respectively. In FIGS. 3A to 7B, the same elements as described in FIGS. 1 and 2 will be indicated by the same reference numerals or the same reference designators. For the purpose of ease and convenience in explanation, the descriptions of the same elements as in FIGS. 1 and 2 will be omitted or mentioned briefly.

Figure 3A:
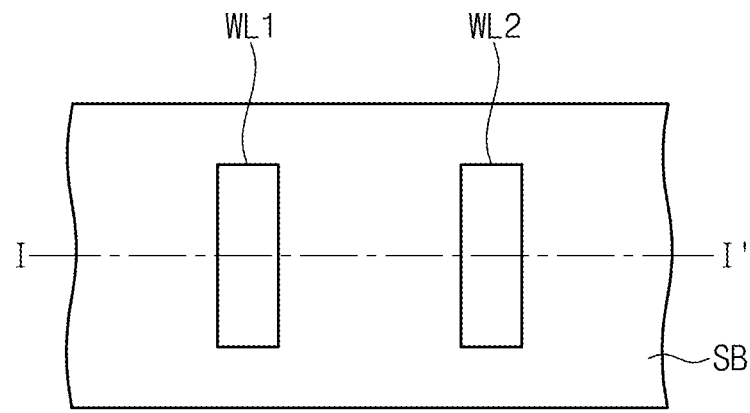
FIGS. 3A, 4A, 5A, 6A, and 7A are planar views illustrating a method of fabricating the vertical thin film transistor of FIG. 1.
Figure 3B:
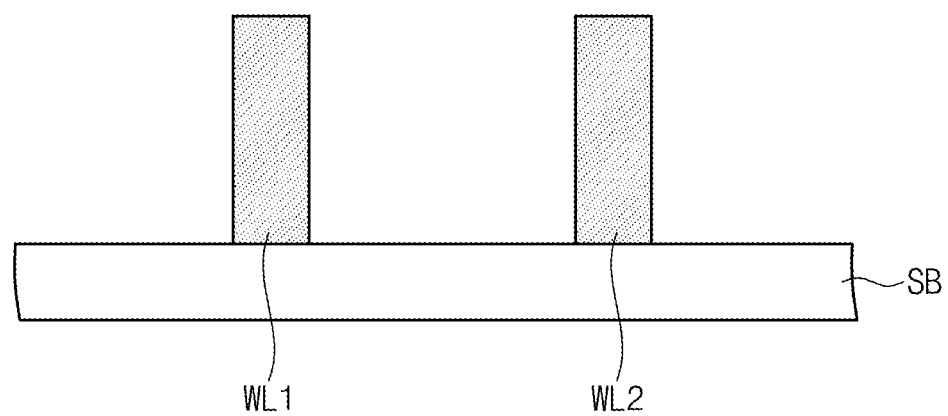
FIGS. 3B, 4B, 5B, 6B, and 7B are cross-sectional views taken along lines I-I' of FIGS. 3A, 4A, 5A, 6A, and 7A, respectively.

Referring to FIGS. 3A and 3B, a substrate SB is prepared. The substrate SB may be a transparent insulator.

A first wall WL1 and a second wall WL2 are formed on the substrate SB. The first wall WL1 and the second wall WL2 may be formed using a patterning process or a printing process. For example, the patterning process may include a photolithography process using a photoresist. For example, the printing process may include an imprint process using a mold.

The first wall WL1 and the second wall WL2 are formed by the same process.

Figure 4A:
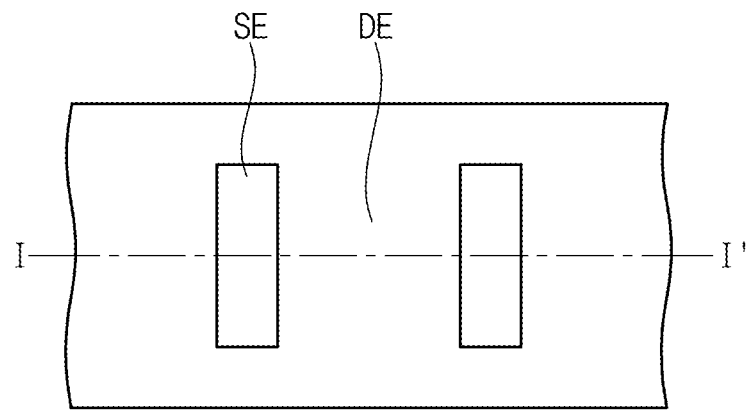
Figure 4B:
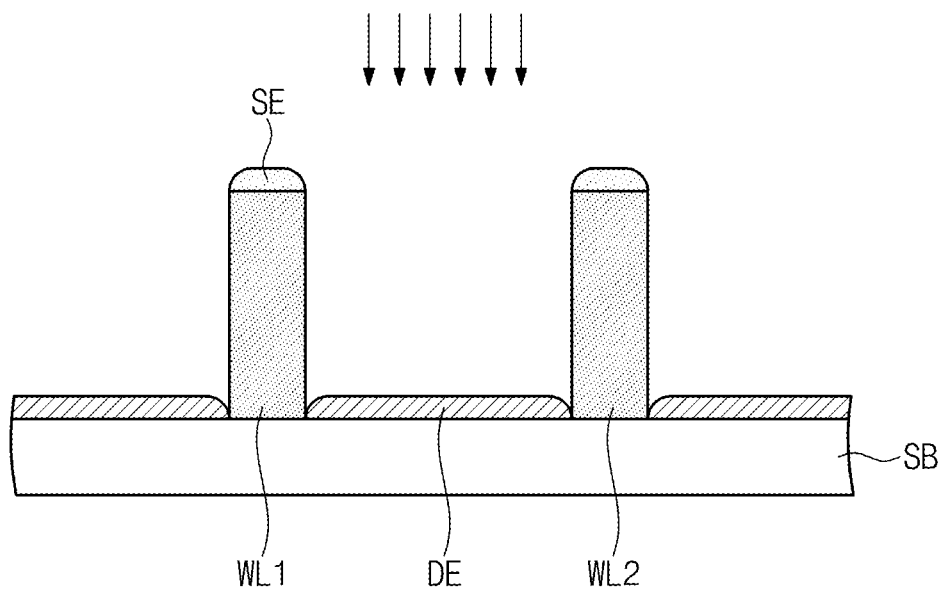

Referring to FIGS. 4A and 4B, a metal (not shown) is deposited on the substrate SB on which the first wall WL1 and the second wall WL2 are formed. The metal (not shown) may be deposited in the third direction DR3 by a sputtering process or an evaporator.

A height of the deposited metal is smaller than heights of the first wall WL1 and the second wall WL2. Thus, the deposited metal (not shown) is divided into a source electrode SE and a drain electrode DE by the first wall WL1 and the second wall WL2, respectively.

If the source electrode SE and the drain electrode DE are formed so as to have a multi-layered structure of two or more layers, a plurality of deposition processes may be sequentially performed.

Figure 5A:
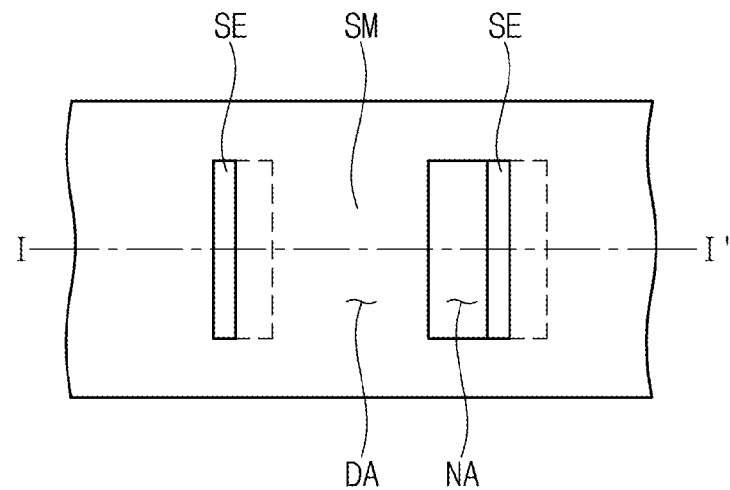
Figure 5B:
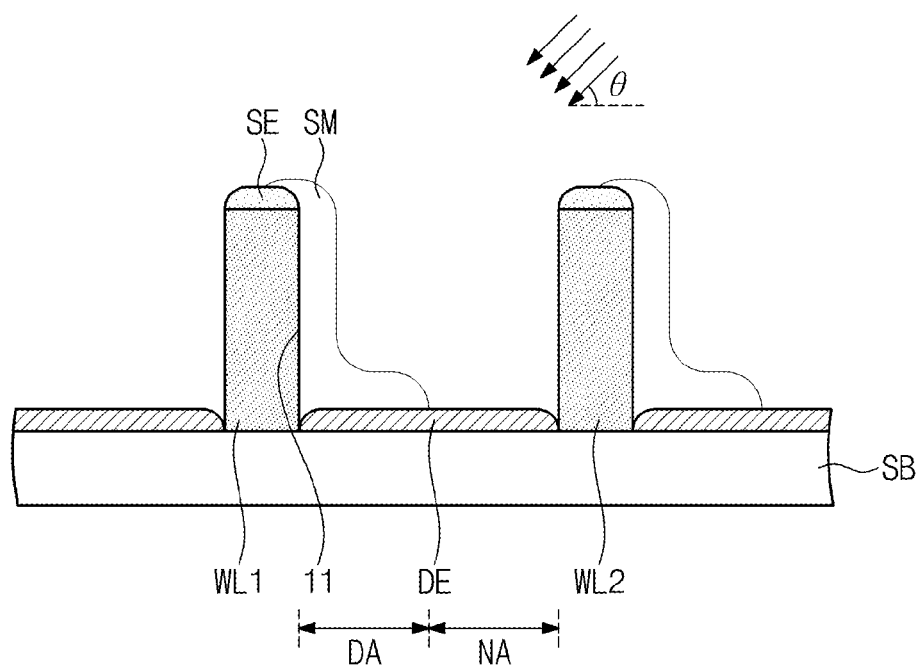

Referring to FIGS. 5A and 5B, subsequently, a semiconductor material (not shown) is slantingly deposited on the substrate SB. At this time, a tilt angle θ may be an acute angle smaller than 90 degrees.

A space between the first wall WL1 and the second wall WL2 may include a first region DA in which the semiconductor material is deposited, and a second region NA in which the semiconductor material is not deposited.

The semiconductor material (not shown) deposited with the tilt angle θ is not blocked by the second wall WL2, such that it is formed in the first region DA. On the other hand, the semiconductor material (not shown) deposited with the tilt angle θ is blocked by the second wall WL2 so that it is not formed in the second region NA.

A general tilt deposition method may be used for slantingly depositing the semiconductor material. For example, a stage (not shown) supporting the substrate SB may be tilted to have the tilt angle θ, and then the semiconductor material may be vertically deposited. However, the inventive concept is not limited thereto. The semiconductor material may be formed by one of various tilt deposition methods.

The semiconductor material is disposed in the first region DA and on a portion of the source electrode SE to form a semiconductor layer SM.

Figure 6A:
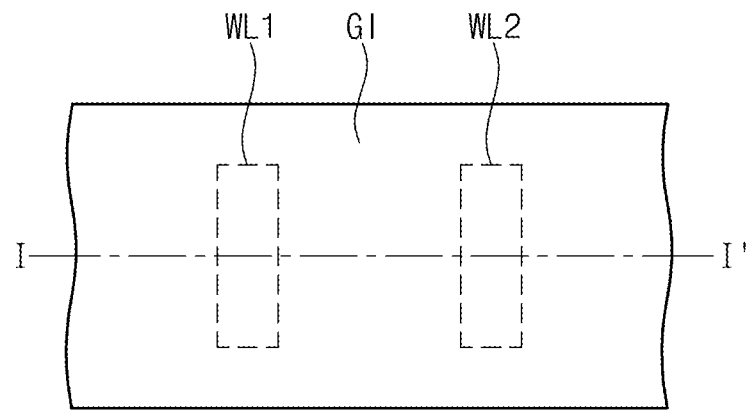
Figure 6B:
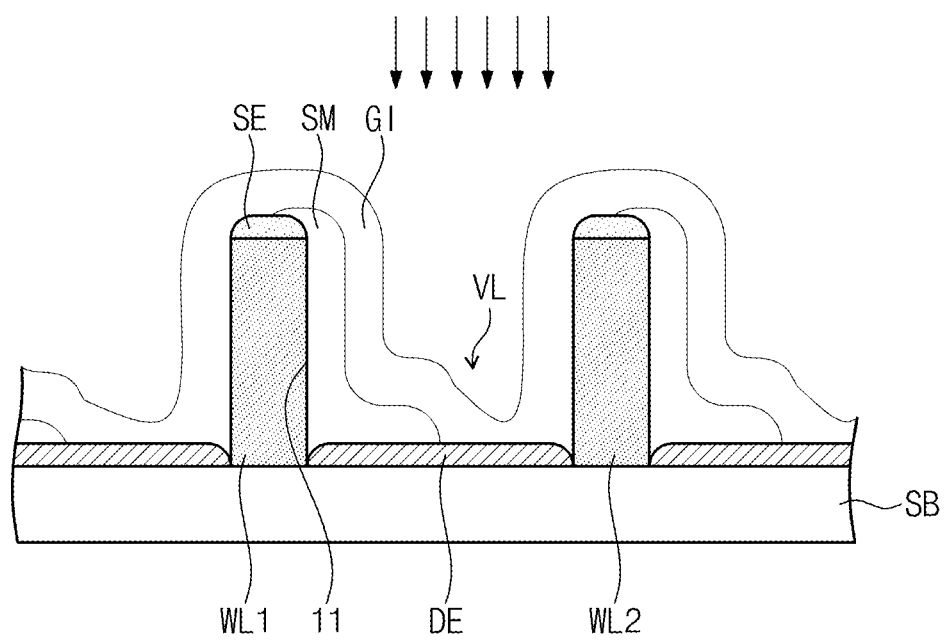

Referring to FIGS. 6A and 6B, subsequently, an insulating material is deposited on the substrate SB having the semiconductor layer SM, thereby forming a gate insulating layer GI.

The process for the formation of the gate insulating layer GI is performed using a deposition method of which a step coverage property is excellent. Thus, the gate insulating layer GI may be uniformly deposited on sidewalls of the first and second walls WL1 and WL2, respective1. Additionally, the gate insulating layer GI may be uniformly deposited on a structural profile caused by the heights of the first and second walls WL1 and WL2, respectively.

For example, the gate insulating layer GI may be formed by an atomic layer deposition (ALD) process or a chemical vapor deposition (CVD) process.

The gate insulating layer GI is conformally formed along the surfaces of the first and second walls WL1 and WL2, respectively, to form a valley VL between the first and second walls WL1 and WL2, respectively.

Figure 7A:
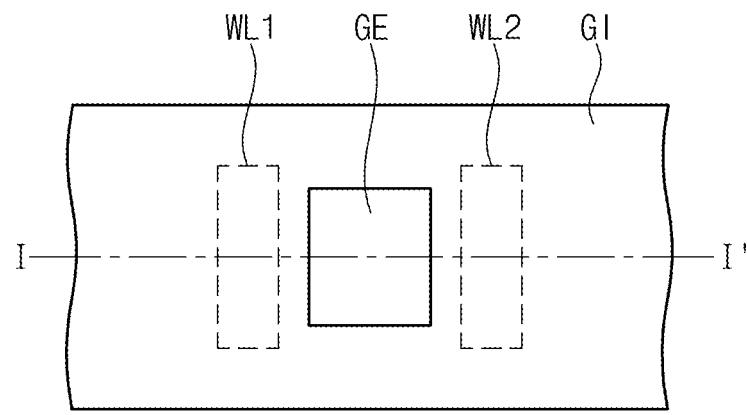
Figure 7B:
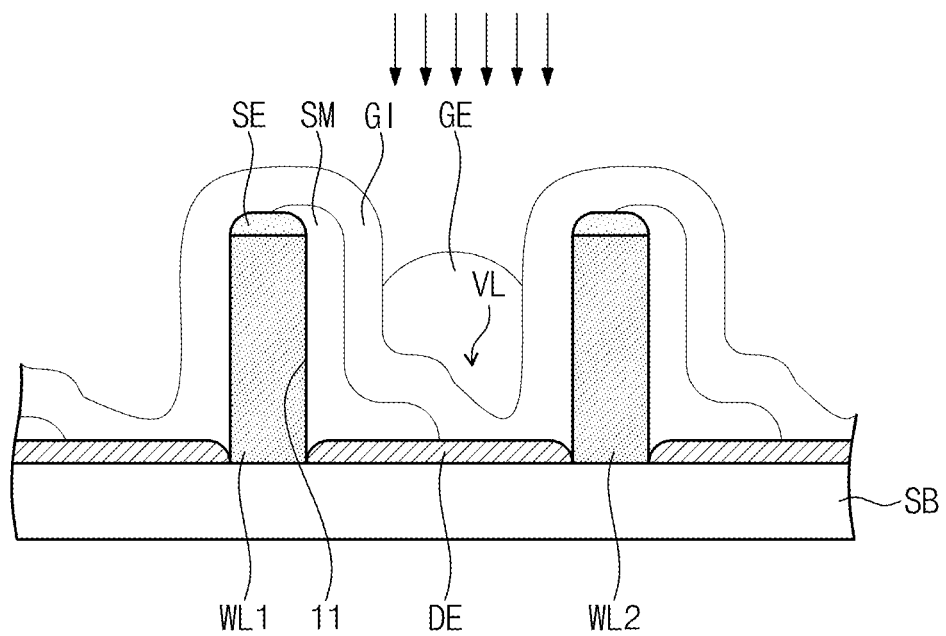

Referring to FIGS. 7A and 7B, a gate electrode GE is formed on the gate insulating layer GI. The gate electrode GE is formed to correspond to the valley VL formed by the gate insulating layer GI. In other words, the gate electrode GE may be formed in the valley VL.

Since the gate electrode GE should be formed between the first wall WL1 and the second wall WL2, the gate electrode GE may be formed by a solution process. For example, the solution process may be one of an inkjet printing process, a gravure printing process, a syringe injection process, a relief printing process, a lithography printing process, a flexography printing process, or a screen printing process.

Even though not illustrated in the drawings, a first contact hole and a second contact hole may be formed for applying signals to the source electrode SE and the drain electrode DE, respectively. The first contact hole may be formed in a region which overlaps with the source electrode SE but does not overlap with the semiconductor layer SM in a planar view. The second contact hole may be formed in a region which overlaps with the drain electrode DE but does not overlap with the gate electrode GE.

In the method of fabricating the vertical thin film transistor according to exemplary embodiments of the inventive concept, the vertical thin film transistor may be formed without a mask or by a minimum number of masks.

According to embodiments of the invention, the vertical thin film transistor may be formed without the mask so that fabricating costs of the vertical thin film transistor may be reduced. Additionally, the current flow of the vertical thin film transistor may be more improved than that of a conventional thin film transistor.

In the method of fabricating the vertical thin film transistor according to the inventive concept, the vertical thin film transistor may be formed without the mask or by the minimum number of the masks.

While the present invention has been described with reference to example embodiments, it will be apparent to those skilled in the art that various changes and modifications may be made without departing from the spirit and scope of the inventive concept. Therefore, it should be understood that the above embodiments are not limiting, but are illustrative. Thus, the scope of the invention is to be determined by the broadest permissible interpretation of the following claims and their equivalents, and shall not be restricted or limited by the foregoing description.

What is claimed is:

1. A vertical thin film transistor, comprising:
   a substrate;
   a first wall provided on the substrate;
   a second wall provided on the substrate and spaced apart from the first wall;
   a source electrode formed on a top surface of the first wall;
   a drain electrode provided on the substrate between the first wall and the second wall;
   a semiconductor layer formed on the source electrode, a sidewall of the first wall, and the drain electrode;

a gate insulating layer covering the first wall, the second wall, the source electrode, the drain electrode, and the semiconductor layer; and a gate electrode formed on the gate insulating layer, the gate electrode being formed between the first wall and the second wall in a planar view of the vertical thin film transistor.

2. The vertical thin film transistor of claim 1, wherein a height of the first wall is greater than a height of each of the source electrode and the drain electrode.

3. The vertical thin film transistor of claim 2, wherein the first wall has a height in a range of about 5 μm to about 20 μm.

4. The vertical thin film transistor of claim 2, wherein each of the source electrode and the drain electrode has a height in a range of about 50 nm to about 100 nm.

5. The vertical thin film transistor of claim 1, wherein the source electrode has a same area and a same shape as the top surface of the first wall in a planar view.

6. The vertical thin film transistor of claim 1, wherein the semiconductor layer includes a channel region extending in a height direction of the first wall.

7. The vertical thin film transistor of claim 6,
wherein an end of the semiconductor layer is in contact with the source electrode; and
wherein another end of the semiconductor layer is in contact with the drain electrode.

8. The vertical thin film transistor of claim 1,
wherein the semiconductor layer overlaps with a portion of the source electrode and a portion of the drain electrode in a planar view; and
wherein the semiconductor layer is spaced apart from the second wall.

9. The vertical thin film transistor of claim 8, wherein a space between the first wall and the second wall includes a first region in which the semiconductor layer is deposited, and a second region in which the semiconductor layer is not deposited.

10. The vertical thin film transistor of claim 1, wherein the semiconductor layer has a thickness in a range of about 20 nm to about 100 nm.

11. The vertical thin film transistor of claim 1,
wherein the gate insulating layer forms a valley between the first wall and the second wall; and
wherein the gate electrode is disposed so as to correspond to the valley.

12. A method of fabricating a vertical thin film transistor, comprising the steps of:
forming a first wall and a second wall on a substrate;
forming a source electrode on a top surface of the first wall and a drain electrode between the first wall and the second wall;
forming a semiconductor layer on the source electrode, a sidewall of the first wall, and the drain electrode;
forming a gate insulating layer on the first wall, the second wall, the source electrode, the drain electrode, and the semiconductor layer; and
forming a gate electrode on the gate insulating layer between the first wall and the second wall.

13. The method of claim 12, wherein the first wall and the second wall are formed using one of a patterning process and a printing process.

14. The method of claim 12, wherein the step of forming the source electrode and the drain electrode comprises:
depositing a metal on the substrate on which the first and second walls are formed; and
dividing the deposited metal into the source electrode and the drain electrode by the first and second walls.

15. The method of claim 12, wherein the semiconductor layer is formed by slantingly depositing a semiconductor material on the substrate.

16. The method of claim 12, wherein the gate insulating layer is formed by one of an atomic layer deposition (ALD) process and a chemical vapor deposition (CVD) process.

17. The method of claim 12, wherein the gate electrode is formed using a solution process.

* * * * *